(12) United States Patent
Stewart

(10) Patent No.: US 7,539,030 B2
(45) Date of Patent: May 26, 2009

(54) ATTRIBUTE CACHE MEMORY

(75) Inventor: Roger Green Stewart, Morgan Hill, CA (US)

(73) Assignee: Applied Wireless Identification Group, Inc., Morgan Hill, CA (US)

( * ) Notice: Subject to any disclaimer, the term of this patent is extended or adjusted under 35 U.S.C. 154(b) by 184 days.

(21) Appl. No.: 11/391,834

(22) Filed: Mar. 28, 2006

(65) Prior Publication Data

US 2007/0247884 A1 Oct. 25, 2007

(51) Int. Cl.
G11C 15/00 (2006.01)

(52) U.S. Cl. .............. 365/49.1; 365/49.17; 365/230.06; 711/108

(58) Field of Classification Search .............. 365/49, 365/49.1, 49.17, 230.06; 711/108
See application file for complete search history.

(56) References Cited

U.S. PATENT DOCUMENTS

| | | | |
|---|---|---|---|
| 4,758,982 A | 7/1988 | Price ........................... 364/900 |
| 5,299,147 A | 3/1994 | Holst ........................... 365/49 |
| 5,383,146 A | 1/1995 | Threewitt .................... 365/49 |
| 5,706,224 A | 1/1998 | Srinivasan et al. ............ 365/49 |
| 5,787,458 A | 7/1998 | Miwa ......................... 711/108 |
| 5,877,639 A | 3/1999 | Porsher et al. .............. 327/114 |
| 5,995,967 A | 11/1999 | Iacobovici et al. .......... 707/100 |
| 6,000,008 A | 12/1999 | Simcoe ....................... 711/108 |
| 6,041,389 A | 3/2000 | Rao ........................... 711/108 |
| 6,128,244 A * | 10/2000 | Thompson et al. ..... 365/230.03 |
| 6,128,697 A | 10/2000 | Mou .......................... 711/108 |
| 6,134,135 A | 10/2000 | Anderson .................... 365/49 |
| 6,262,923 B1 * | 7/2001 | Fujita ......................... 365/200 |
| 6,351,143 B1 | 2/2002 | Guccione et al. ............. 326/40 |
| 6,529,418 B2 * | 3/2003 | Nakai et al. ............ 365/189.04 |
| 6,614,685 B2 | 9/2003 | Wong .................... 365/185.11 |
| 6,748,484 B1 | 6/2004 | Henderson et al. .......... 711/108 |
| 6,816,396 B2 | 11/2004 | Chai et al. ..................... 365/49 |
| 6,873,532 B2 | 3/2005 | Foss ............................. 365/49 |
| 6,888,730 B2 | 5/2005 | Foss et al. ..................... 365/49 |
| 2005/0146910 A1 * | 7/2005 | Venkatraman et al. ........ 365/51 |
| 2005/0216656 A1 | 9/2005 | Rosenbluth et al. ......... 711/108 |

* cited by examiner

*Primary Examiner*—Huan Hoang
(74) *Attorney, Agent, or Firm*—Zilka-Kotab, PC

(57) ABSTRACT

A memory system according to one embodiment includes a plurality of content addressable word decoders, and memory cells associated with each of the word decoders. A memory system according to another embodiment includes a word decoder storing an identifier which is a subset of a memory address, the word decoder being responsive to a match of the identifier and an incoming subset of the memory address. A memory system according to yet another embodiment includes a word decoder having more than sixteen address line inputs. A memory system according to a further embodiment includes a word decoder array having fewer word decoders than combinations of memory addresses. Methods are also provided.

30 Claims, 8 Drawing Sheets

ATTRIBUTE CACHE MEMORY

FIELD OF THE INVENTION

The present invention relates to digital read/write memory, and more particularly, this invention relates to a new memory type having attributes of both random access memory and content addressable memory.

BACKGROUND OF THE INVENTION

The most common type of digital read/write memory is random access memory (RAM). RAM is responsive to an address bus and a control bus, and generally has a bidirectional data bus. An address is put on the address bus by a central processing unit (CPU), direct memory access (DMA) device, or other addressing device to specify a unique storage location within the RAM. The addressing mechanism of a RAM is said to be unambiguous since each address on the address bus specifies one and only one storage location within the RAM.

While RAM is well suited for many digital applications, it is not particularly well suited for use in systems which process associative data. For example, the sequential access to data when addressing RAM can be inefficient for systems involved in pattern recognition, natural language recognition, sparse matrix processing, and database interrogation.

A type of digital read/write memory which is better suited for systems which process associative data is known as content addressable memory (CAM). Storage locations within CAM are addressed simultaneously and in parallel by an incoming bit pattern called a comparand. Part of the contents of each storage location within the CAM can be considered to be an address field, where the remainder of the storage location can be considered to be an associated data field. When the associated data field is used to address another device, it is sometimes called a pointer field and is said to contain a pointer address.

With a CAM the comparand is compared, in parallel, to the address fields of all storage locations, and if the address fields have the desired relationship to the comparand the associated data field at that location can be accessed. Alternatively, the comparand can be compared to the entirety of each of the storage locations to detect whether the particular bit pattern corresponding to the comparand is stored within the CAM, in which case the presence or absence of the comparand amongst the contents is indicated by a Boolean output signal (flag).

A typical CAM includes a comparand input bus, a control input bus, a valid match output, and a bidirectional data bus. A number of comparison operations built into the CAM and selected by the control bus may be allowable, including equality, inequality, less than, greater than, etc.

CAM, as opposed to RAM, may have ambiguous addresses. In other words, a number of address fields within the CAM may hold the same contents. If ambiguous addressing is allowed, then multiple responses will result upon a compare. Multiple responses from a CAM are usually accessed serially.

The amount of memory required by a digital system is often greater than that available on a single device. Furthermore, by being able to build a memory system from a number of memory devices the architecture of the memory system is not limited by the architecture of the memory device. In consequence, a number of individual memory devices are commonly connected horizontally and/or vertically in a matrix configuration. The horizontal connection of memory elements increases the effective width of a stored word of memory, and the vertical connection of memory elements increases the number of memory locations available in the memory system.

With RAM memory, the methods for horizontally and vertically connecting memory devices are well known. The vertical connection of CAM elements is likewise a straightforward matter. However, engineers attempting the horizontal cascading of CAM elements have had trouble in achieving their goals because of the difficulties involved in conveying match information between the CAM elements. In the past, the conveyance of match information required multi-cycle comparisons of the individual devices, or an unacceptably large number of intersubfield bus lines.

One known commercially available CAM device which provides a solution to the horizontal cascading problem is the Fairchild F100142 4×4 CAM, which has one open emitter line associated with each memory location to convey intersubfield linking information. This solution requires one pin per memory location for intersubfield communication, resulting in a chip of very low data storage capacity. For example, using the Fairchild F100142 device, a modest 1 K×16 CAM system would require 1024 devices, each residing in a 28 pin package and consuming up to 288 mA at 4.2 V. This hypothetical memory system would therefore consume over 1.2 kilowatts of power. Such a system is inappropriate for most applications.

CAM devices are relatively more expensive than RAM devices of the same storage capacity. One reason for this is that the circuitry of CAM is intrinsically more complex than the circuitry of RAM. Each memory cell within a CAM must have both storage capabilities and comparison capabilities, while RAM only needs to have the storage capabilities. Furthermore, the control logic of a CAM tends to be more complex than the control logic of a RAM. Another reason for the cost disparity between the two types of devices is that many more RAM devices are manufactured than CAM devices, allowing for lower production costs for RAM.

It would therefore be desirable to achieve CAM functionality with RAM efficiency and low cost.

SUMMARY OF THE INVENTION

A memory system according to one embodiment includes a plurality of content addressable word decoders, and memory cells associated with each of the word decoders. The memory cells can be traditional types of memory such as RAM (e.g., SRAM, DRAM, etc.), ROM (e.g., EEPROM), etc.

A memory system according to another embodiment includes a word decoder storing an identifier which is a subset of a memory address, the word decoder being responsive to a match of the identifier and an incoming subset of the memory address.

A memory system according to yet another embodiment includes a word decoder having more than sixteen address line inputs.

A memory system according to a further embodiment includes a word decoder array having fewer word decoders than combinations of word decoder memory addresses.

A memory system according to yet another embodiment includes a plurality of memory cells, the memory cells grouped into a plurality of memory clusters, each of the clusters storing at least one data word, a plurality of first addressing mechanisms for selecting a particular one of the memory clusters, and a second addressing mechanism for selecting one of the word packets in a selected one of the memory clusters.

A method for providing access to kill codes includes identifying an identification number of an RF tag, matching at least a portion of the identification number to a stored memory address, accessing a word packet or memory cell at the memory address, and retrieving a kill code from the word packet or memory cell.

An RFID system includes a plurality of RFID tags and an RFID reader in communication with the RFID tags. Each tag may be coupled to an object, each tag storing information about the object to which coupled. Likewise, each tag may have a unique identifier, the identifier being correlated with information about the object in a database.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each of the various possible combinations and permutations.

The following description discloses a memory system implementing a new word decoder with associated memory cells (e.g., RAM) to provide CAM functionality with RAM efficiency and low cost. In brief, clusters of memory cells are each associated with a programmable word decoder to form an array of memory cluster-decoder pairs. To program a memory cluster-decoder pair, a unique identifier is programmed into the programmable decoder. An illustrative write operation includes selecting an empty spot (or spot to overwrite), program the decoder, and write data to the memory associated with the decoder. An illustrative read operation includes searching for the identifier in all word decoders simultaneously. When a match is found, that cluster is read.

The memory systems described herein may be implemented on a single chip, may include a plurality of chips and peripheral circuitry, or may include a host device implementing one or more memory chips.

Figure 1:
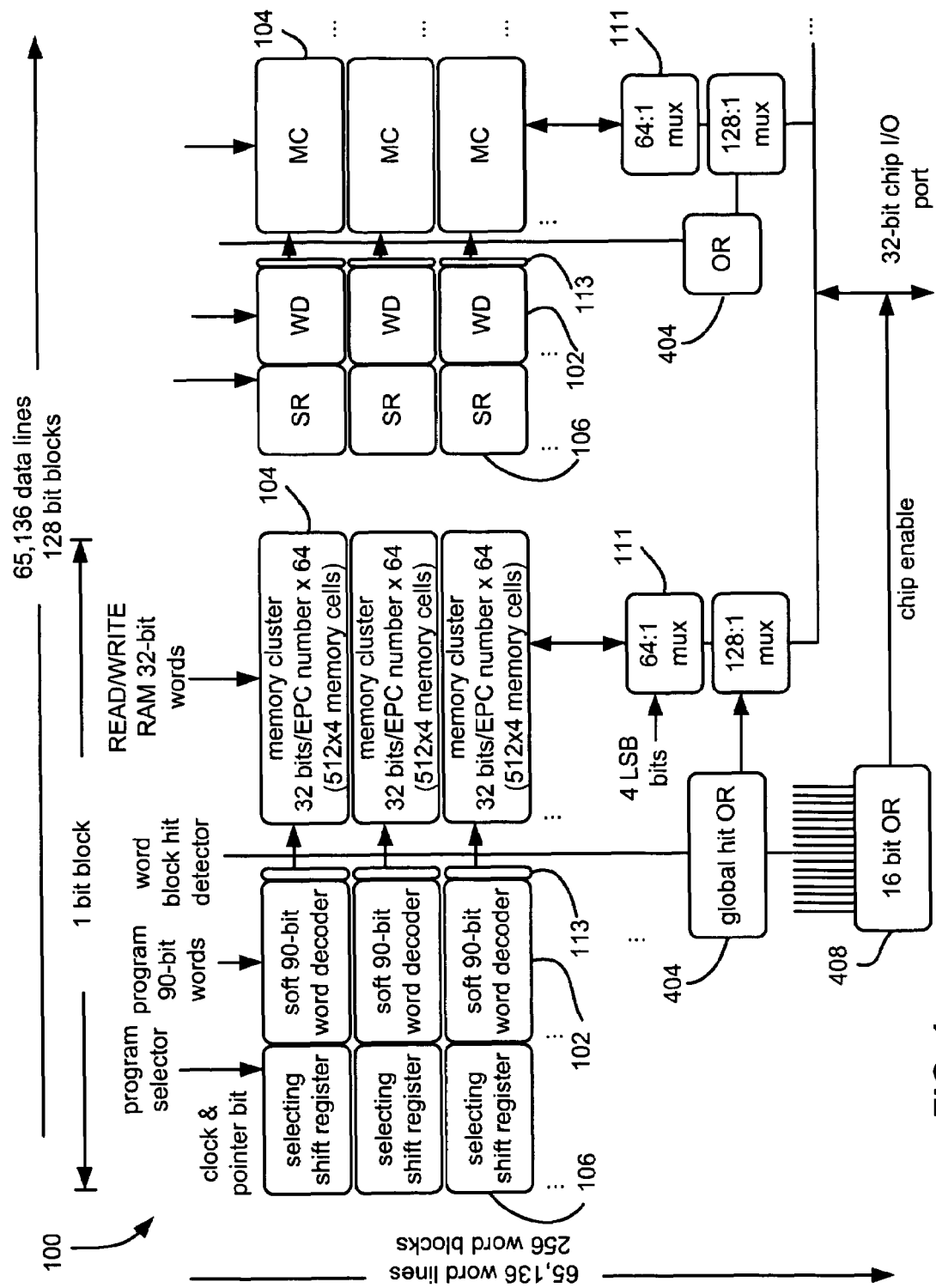
FIG. 1 is a system diagram of a memory system according to one embodiment of the present invention.

FIG. 1 illustrates a memory system 100 according to one embodiment of the present invention. As shown, the memory system includes an array of addressing mechanisms 102, which store a unique address code, or "word." These addressing mechanisms are referred to herein as word decoders 102. During a data retrieval process, when a matching address is detected by the word decoder 102, the memory cluster 104 associated with the word decoder 102 is selected, and the contents thereof can be read. Each memory cluster 104 may comprise one or more word packets, each word packet comprising one or more memory cells.

Preferred embodiments use traditional memory in the memory cells. For example, the particular memory cell(s) making up each memory cluster 104 may be unmodified RAM such as DRAM, SRAM, etc. that is otherwise substantially identical in size and composition to their counterparts in conventional RAM; writeable and unwriteable nonvolatile memory such as various types of ROM, flash memory, etc.; and combination thereof. For simplicity, the various types of memory will be described in terms of random access memory, it being understood that the term "random access memory" as used herein is meant to encompass all types of memory including traditional RAM, ROM, and other memory types. The memory clusters 104 and their constituent word packet(s) can be of any size.

Thus, the array is CAM free in the traditional sense. However, the word decoders 102 provides CAM-like functionality to the memory system 100. By performing CAM-like functions in the word decoder 102, the memory system 100 can achieve CAM functionality at only a fraction of the cost of pure CAM memory and with the efficiency of RAM.

FIG. 1 shows a soft 90 bit word decoder 102, though in practice, the number of bits used for addressing can be higher or lower. For the present discussion, consider an illustrative embodiment having a 90 bit word decoder 102, it being understood that the word decoders can have any number of address line inputs, e.g., 10, 16, 20, 50, 90, 150, 1000, etc.

Figure 2:
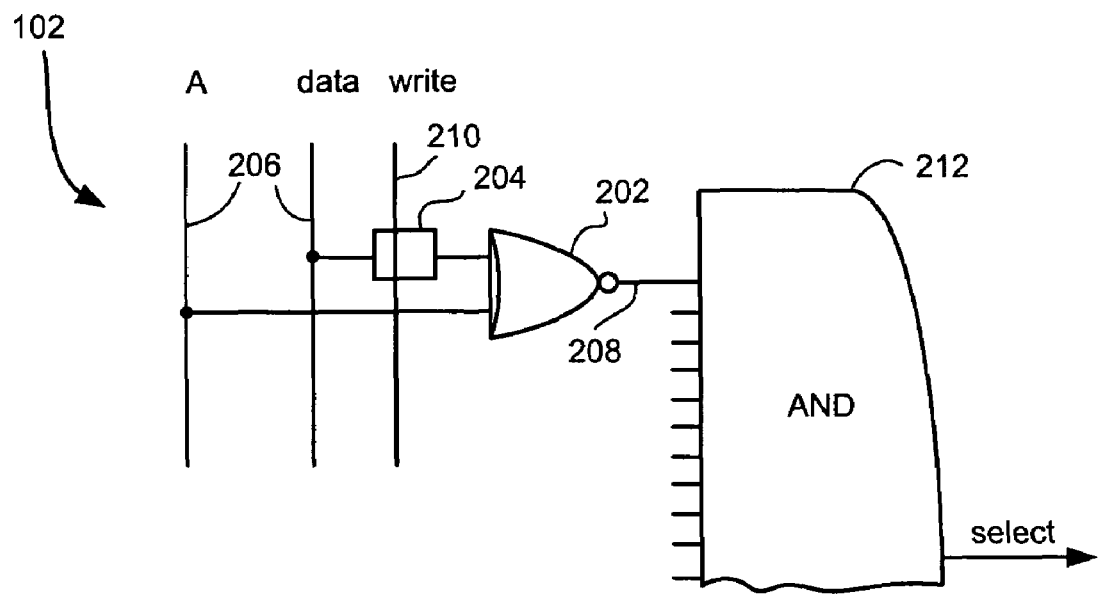
FIG. 2 is a partial system diagram of a word decoder according to an illustrative embodiment of the present invention.

According to one illustrative embodiment, each decoder has 90 sets of the following components, as shown in FIG. 2: an exclusive OR (XOR) gate 202, a writeable latch 204, an address input line or lines 206, an output line 208, and a write line 210. The XOR gate 202, which typically has 4 transistors, looks for a particular signal. Whether the XOR gate 202 provides a matching output or not is a function of the value stored in the latch 204. Particularly, the value stored in the latch 204 determines whether the XOR gate responds to a 1 or 0. An illustrative latch is a one bit, 4 transistor latch. In some embodiments, there may be two address lines for each comparand and its compliment. Other embodiments have one memory address line that goes high (1) or low (0). The output line 208 of each set goes into an AND gate 212 with 90 inputs. The AND gate 212 functions as a matcher. If all the 90 AND inputs are high, indicating the input data matches the stored data, the AND output will go high, indicating a match and allowing the device to select the memory cluster 104. If any are different, the AND output will stay low. As is well known in the art, the 90 bit AND may in practice be implemented with an assembly of smaller AND and/or NAND gates. Accordingly, the word decoder 102 described in FIG. 2 is flexible, in that it can mimic a standard memory select function and yet provide CAM-like cluster 104 selection.

Prior art RAM cells work one memory address at a time, as data address are searched for in software. Those skilled in the art will appreciate how time consuming a content-dependent memory search can be. In sharp contrast, the inventive memory system 100 can check all word decoders 102 in parallel. Thus, a 90 bit code can be presented simultaneously to 2 million word decoders 102 within the same chip. Within a multi-chip memory system, the 90-bit code may be presented to tens of millions of word decoders simultaneously. Accordingly, the memory system 100 behaves like a massively parallel computer, allowing it to respond much faster than a RAM-based system and in typically less than about 100 nanoseconds. The attribute cache memory is also much more power-efficient than either existing RAM-based or CAM-based systems.

The word decoders 102 can be programmed anywhere within a very large database, as the memory system 100 may have e.g., 90 bits of potential memory addresses. In a typical system, however, the memory system 100 will not have the trillions of word decoders 102 made possible by a 90 bit addressing scheme. Rather, typically, each memory chip 100 will have tens of thousands of word decoders 102. Each memory cluster 104 associated with a particular word decoder 102 may in turn have several word packets, each word packet storing some specific data in its associated memory cells. In this way, several word packets can be accessed upon matching a single address in a word decoder 102.

If there are several word packets per memory cluster 104, some mechanism is needed to address each particular memory word packet. One way to do this is to use the most significant bits (MSBs) of a memory address to select a particular memory cluster 104 (via the word decoders), and then use the least significant bits (LSBs) to find a particular word packet in the selected memory cluster 104. In the example shown in FIG. 1, the word decoder 102 is a 90 bit word decoder 102. Assume the memory addresses are each 96 bits long, as in a typical EPC number (discussed below). Thus, a match of the 90 MSBs in a word decoder 102 selects a particular memory cluster 104. Then, the last six LSBs are used to select one of the 64 word packets in the selected memory cluster 104. Thus, the memory system 100 may have full CAM functionality to pick the memory cluster 104 via the memory address MSBs and word decoder 102, and then use the LSBs to select a particular word packet.

In one example, assume the memory cluster 104 array is organized into 32 bit word packets, and 64 word packets are associated with each address (and thus memory cluster 104). Further, assume that the memory addresses for each of the 64 words stored in the cluster are consecutively numbered. By selecting a memory cluster 104, the system has access to 64 adjacent 32 bit word packets. The memory system (e.g., chip) 100 may then use the six LSBs (or whichever bits are sequential) in the memory address to select the appropriate word packet within the cluster. In one embodiment, a 4:1 multiplexer 113 is positioned near the output of the word decoder to allow selection of a particular word line using the $5^{th}$ and $6^{th}$ LSBs (e.g., A4, A5). Similarly, the $5^{th}$ LSB could be used to select between two word lines via a 2:1 multiplexer. In the example shown, each word line allows selection of up to 512 memory cells. A 16:1 multiplexer (mux) 111 enables selection of individual word packets from along the selected word line, using the four LSBs (e.g., A0, A1, A2, A3) of the address.

As apparent from the previous discussion, the word decoder 102 may need to be programmed, if not already preprogrammed, e.g., in the factory, from previous write process, etc. Accordingly, two writes may be performed; one to the word decoder 102 and one to the memory cluster 104 to not only load the contents but also to save the locations of the contents. When data is loaded into the memory system 100, one procedure is to look for the first word decoder 102 that is empty, and write the address into it. For example, the shift register 106 can be used to find first word decoder 102 that doesn't hit. When an empty (or no longer needed) word decoder 102 is found and written to, the data is also loaded into the memory cluster 104 (or portion thereof), overwriting any previous data therein.

Referring again to FIG. 1, a shift register 106 can be used to select a particular word decoder 102, for such things as reading or writing to an available/occupied latch or memory cell/cluster, etc.

Figure 3:
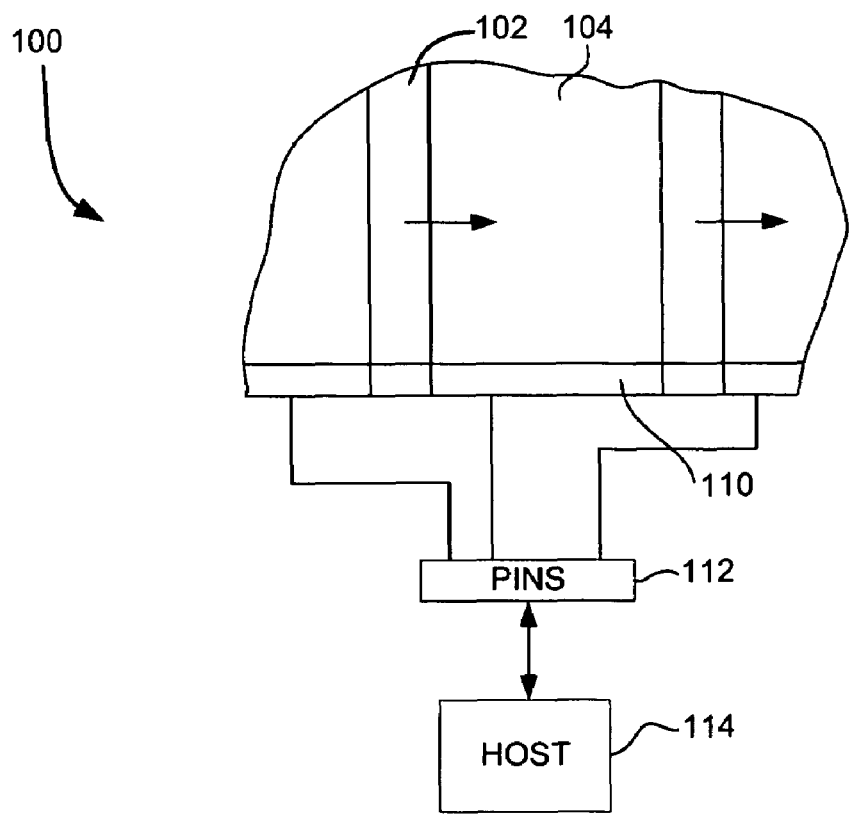
FIG. 3 is a partial system diagram of a memory system according to an illustrative embodiment of the present invention.

As mentioned above, the memory system 100 may include one or many chips. On an illustrative chip, shown in FIG. 3, the array of word decoders 102 is typically positioned along an array of the memory clusters 104. The outgoing data is sent through a bit decode section 110 to pins 112 coupled to a host 114.

Figure 4:
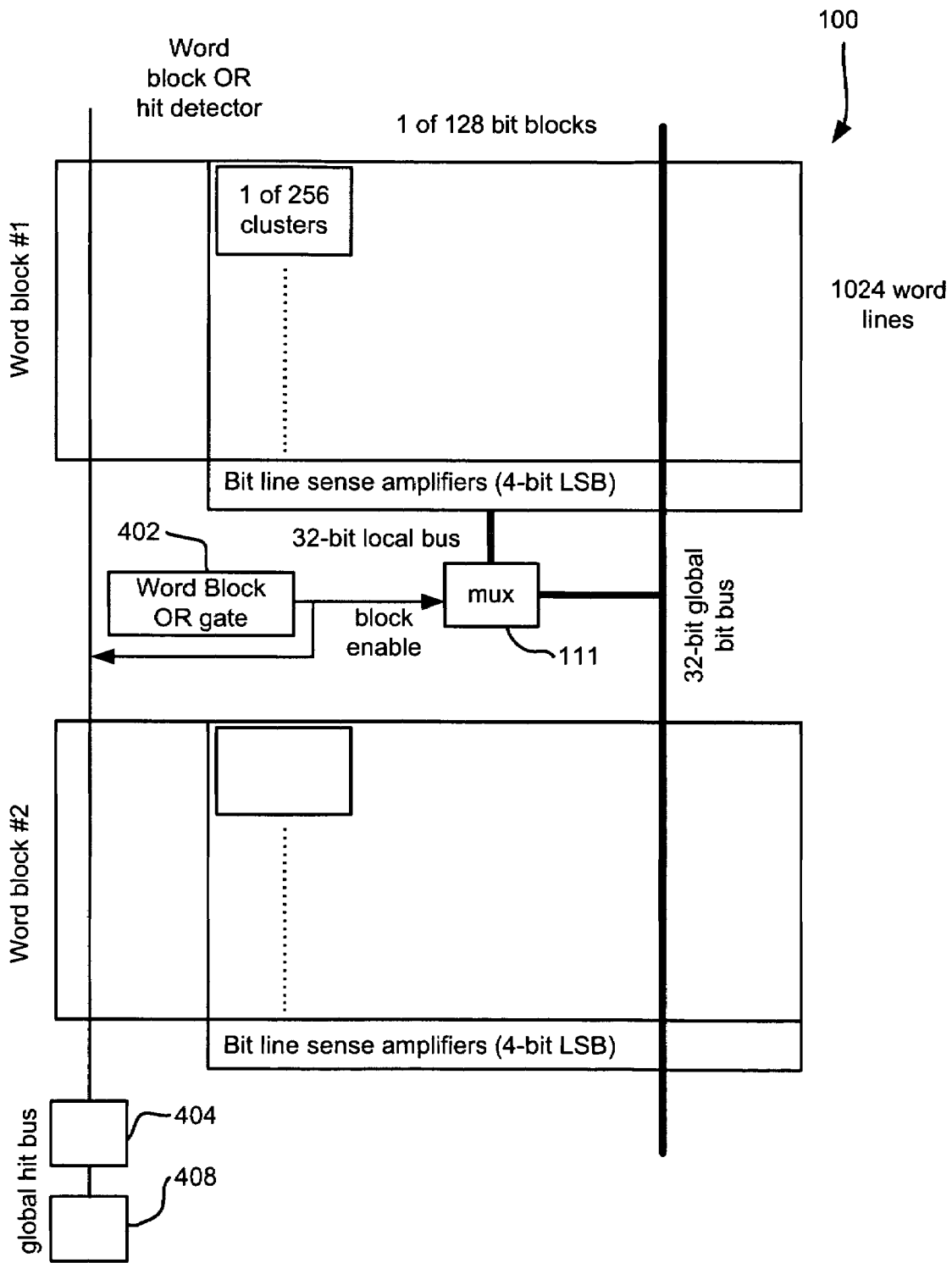
FIG. 4 is a partial system diagram illustrating hit detection according to an illustrative embodiment of the present invention.

FIG. 4 illustrates how hit detection functions in one embodiment. If one of the word decoders "hits", i.e., a match is made, a local hit detector 402 sends a signal to a global hit detector 404. Each word block 406 of clusters 104 has a local hit detector 402 associated with it. Various global hit detectors 404 are also present. When a global hit detector activates, a chip hit detector 408 sets chip enable. The various hit detectors may be OR or NOR gates, or other appropriate circuit. An illustrative chip hit detector 408 includes an OR gate with 129 lines: 128 inputs from the memory cluster 104 array, and a $129^{th}$ output to indicate a hit. When chip enable is sent, communications between the chip and host is performed, with the memory request routed back to the correct bit bus.

The inventive memory system also provides some benefits in terms of updating. One of the problems with CAM is it tends to clog itself. If using CAM as cache memory, the address blocks will eventually fill up if unneeded data is not removed periodically. RAM on the other hand has fixed addresses, so there is no need to clear them. The inventive memory system allows implementation of clear-upon-read, where a particular word decoder is cleared upon its memory location being selected. The memory system may also provide a periodic "cleanup" procedure, where those addresses no longer needed are selected and erased en masse. Word packet-only as well as full erase functions are also permitted.

In its "data dump" mode, the shift register may also be used to serially read out each active address along with its associated memory cluster contents.

Although, in a preferred embodiment, a shift register is used to provide alternative physical access to the word decoders, it will be apparent to those skilled in the art that a supplementary conventional word decoder could be used instead.

A preferred implementation of the memory system described herein is in conjunction with a Radio Frequency Identification (RFID) system. RFID tags are quickly gaining popularity for use in the monitoring and tracking of an item. RFID technology allows a user to remotely store and retrieve data in connection with an item utilizing a small, unobtrusive tag. As an RFID tag operates in the radio frequency (RF) portion of the electromagnetic spectrum, an electromagnetic or electrostatic coupling can occur between an RFID tag affixed to an item and an RFID tag reader. This coupling is advantageous, as it precludes the need for a direct contact or line of sight connection between the tag and the reader.

Utilizing an RFID tag, an item may be tagged at a period when the initial properties of the item are known. For example, this first tagging of the item may correspond with the beginning of the manufacturing process, or may occur as an item is first packaged for delivery. Electronically tagging the item allows for subsequent electronic exchanges of information between the tagged item and a user, wherein a user may read information stored within the tag and may additionally write information to the tag.

Figure 5:
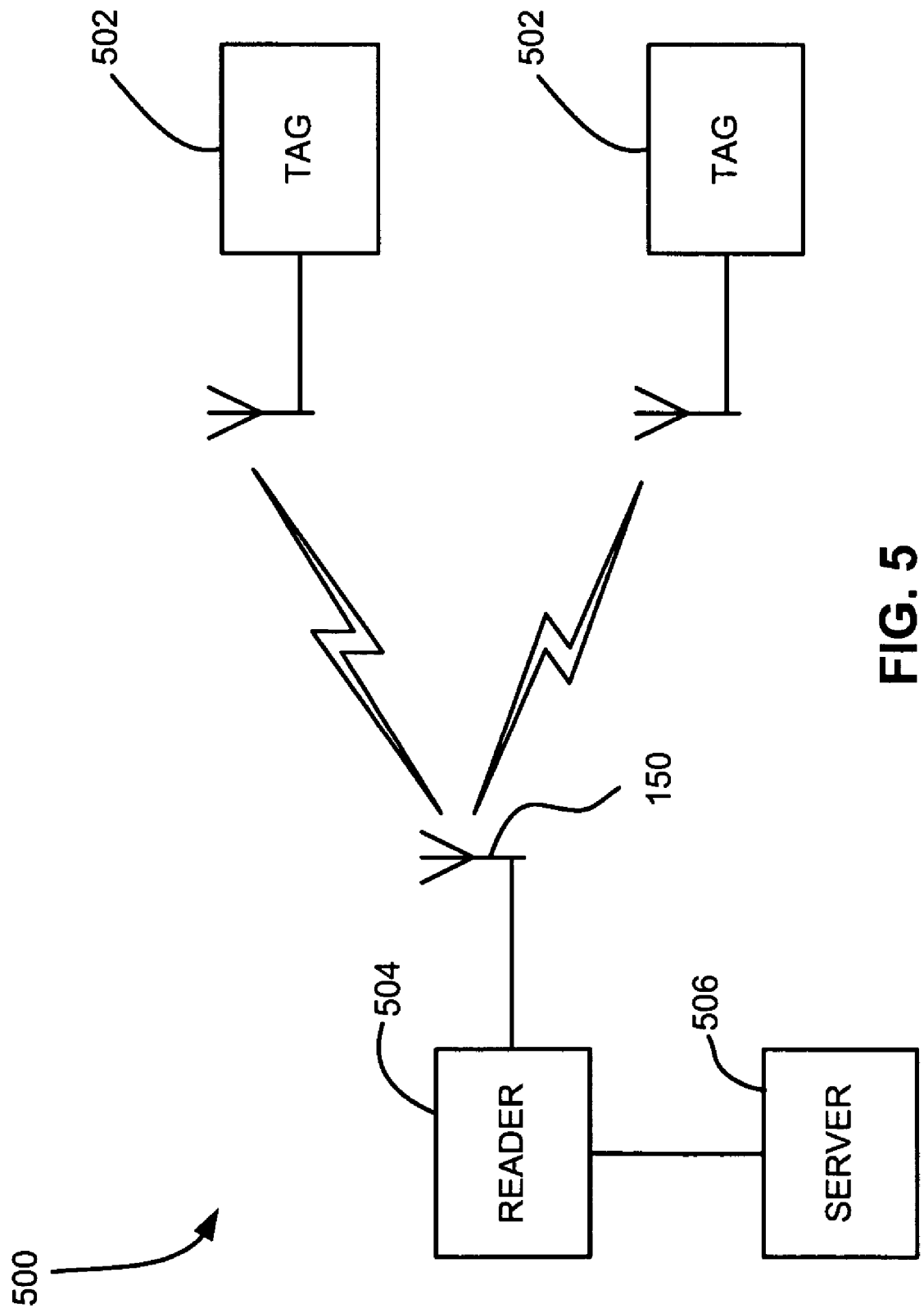
FIG. 5 is a system diagram of an RFID system according to one embodiment of the present invention.

As shown in FIG. 5, an RFID system 500 typically includes RFID tags 502, an interrogator or "reader" 504, and an optional server 506 or other backend system which may include databases containing information relating to RFID tags and/or tagged items. Each tag 502 may be coupled to an object. Each tag 502 includes a chip and an antenna. The chip includes a digital decoder needed to execute the computer commands that the tag 502 receives from the reader 504. The chip may also include a power supply circuit to extract and regulate power from the RF reader; a detector to decode signals from the reader; a backscatter modulator, a transmitter to send data back to the reader; anti-collision protocol circuits; and at least enough memory to store its unique identification code, e.g., Electronic Product Code (EPC).

The EPC number is a simple, compact identifier that uniquely identifies objects (items, cases, pallets, locations, etc.) in the supply chain. The EPC is built around a basic hierarchical idea that can be used to express a wide variety of different, existing numbering systems, like the EAN.UCC System Keys, UID, VIN, and other numbering systems. Like many current numbering schemes used in commerce, the EPC is divided into numbers that identify the manufacturer and product type. In addition, the EPC uses an extra set of digits, a serial number, to identify unique items. A typical EPC number contains:

1. Header, which identifies the length, type, structure, version and generation of EPC;
2. Manager Number, which identifies the company or company entity;
3. Object Class, similar to a stock keeping unit or SKU; and
4. Serial Number, which is the specific instance of the Object Class being tagged.

Additional fields may also be used as part of the EPC in order to properly encode and decode information from different numbering systems into their native (human-readable) forms.

Each tag 502 may also store information about the item to which coupled, including but not limited to a name or type of item, serial number of the item, date of manufacture, place of manufacture, owner identification, origin and/or destination information, expiration date, composition, information relating to or assigned by governmental agencies and regulations, etc. Furthermore, data relating to an item can be stored in one or more databases linked to the RFID tag. These databases do not reside on the tag, but rather are linked to the tag through a unique identifier(s) or reference key(s).

Communication begins with a reader 504 sending out signals via radio wave to find a tag 502. When the radio wave hits the tag 502 and the tag 502 recognizes and responds to the reader's signal, the reader 504 decodes the data programmed into the tag 502. The information is then passed to a server 506 for processing, storage, and/or propagation to another computing device. By tagging a variety of items, information about the nature and location of goods can be known instantly and automatically.

Many RFID systems use reflected or "backscattered" radio frequency (RF) waves to transmit information from the tag 502 to the reader 504. Since passive (Class-1 and Class-2) tags get all of their power from the reader signal, the tags are only powered when in the beam of the reader 504.

The Auto ID Center EPC-Compliant tag classes are set forth below:

Class-1
 Identity tags (RF user programmable, range ~3 m)
 Lowest cost
Class-2
 Memory tags (8 bits to 128 Mbits programmable at ~3 m range)
 Security & privacy protection
 Low cost
Class-3
 Semi-passive tags (also called semi-active tags)
 Battery tags (256 bits to 64 Kb)
 Self-Powered Backscatter (internal clock, sensor interface support)
 ~100 meter range
 Moderate cost
Class-4
 Active tags
 Active transmission (permits tag-speaks-first operating modes)
 ~30,000 meter range
 Higher cost In RFID systems where passive receivers (i.e., Class-1 and Class-2 tags) are able to capture enough energy from the transmitted RF to power the device, no batteries are necessary. In systems where distance prevents powering a device in this manner, an alternative power source must be used. For these "alternate" systems (also known as active or semi-passive), batteries are the most common form of power. This greatly increases read range, and the reliability of tag reads, because the tag does not need power from the reader to respond. Class-3 tags only need a 10 mV signal from the reader in comparison to the 500 mV that a Class-1 tag needs to operate. This 2,500:1 reduction in power requirement permits Class-3 tags to operate out to a distance of 100 meters or more compared with a Class-1 range of only about 3 meters. Note that semi-passive and active tags may also operate in passive mode, using only energy captured from an incoming RF signal to operate and respond.

Active, semi-passive and passive RFID tags may operate within various regions of the radio frequency spectrum. Low-frequency (30 KHz to 500 KHz) tags have low system costs and are limited to short reading ranges. Low frequency tags may be used in security access and animal identification applications for example. Ultra-High-Frequency (UHF) (850 MHz to 950 MHz and 2.4 GHz to 2.5 GHz) tags offer increased read ranges and high reading speeds. One illustrative application of UHF tags is automated toll collection on highways and interstates.

It should be kept in mind that the present invention can be implemented in any type of system, and the RFID implementations described herein are presented as only some of the possible implementations.

When the inventive memory system is implemented in conjunction with an RFID system, for example, in most cases, the numbers associated with a group of objects will be identification numbers such as EPC numbers, and will be sequential. Thus, the most significant bits will be the same for all of the EPC numbers. For example, there typically will be 64 boxes of wheat cereal, each having a unique EPC number, with all 64 numbers being consecutive. Only the last six (least significant) bits change from number to number. The inventive memory system may take advantage of this consecutiveness in combination with its CAM-like functionality to increase the efficiency of the memory system. Accordingly, in one embodiment, not necessarily limited to RF systems, the word decoder is content addressable based on the most significant bits.

As mentioned above, each memory cluster may be capable of storing a number of data words, each word being stored in a word packet of the memory cluster. If a memory address, e.g., EPC code, has a given series of most significant bits and no other memory address has the same series of most significant bits, then only that one word is written in the memory cluster. However, when using e.g., 96 bit EPC numbers, this is not the typical case. Typically, a series of items will be tagged with EPC numbers that have identical MSBs and consecutive LSBs. Thus, the MSBs can be used as the address for the word decoders to select a memory cluster, and the LSBs can be used to select a particular word packet in the selected memory cluster. Accordingly, the data words associated with the consecutive memory addresses (EPC numbers) are entered in sequence in the word packet of the memory cluster associated with the MSB portion of the memory address. To place the benefit of grouping data in clusters in context, assume there are 32 million items in a warehouse, each with a unique EPC code. The memory system might only need on-half million word decoders if each memory cluster contains 64 word packets associated with 16 memory addresses. Accordingly, where 64 data word packets are present per memory cluster, the storage capability of the memory system is increased by a factor of 64×.

Thus, the memory scheme presented herein works under all conditions, and is more efficient if the data has some order. Accordingly, it is ideal for EPC numbers. Thus, the performance is high enough, and the cost of the memory system is low enough to make it practical for implementation in large database situations such as storing data associated with the EPC numbers for all products in a large chain retail store.

Figure 6:
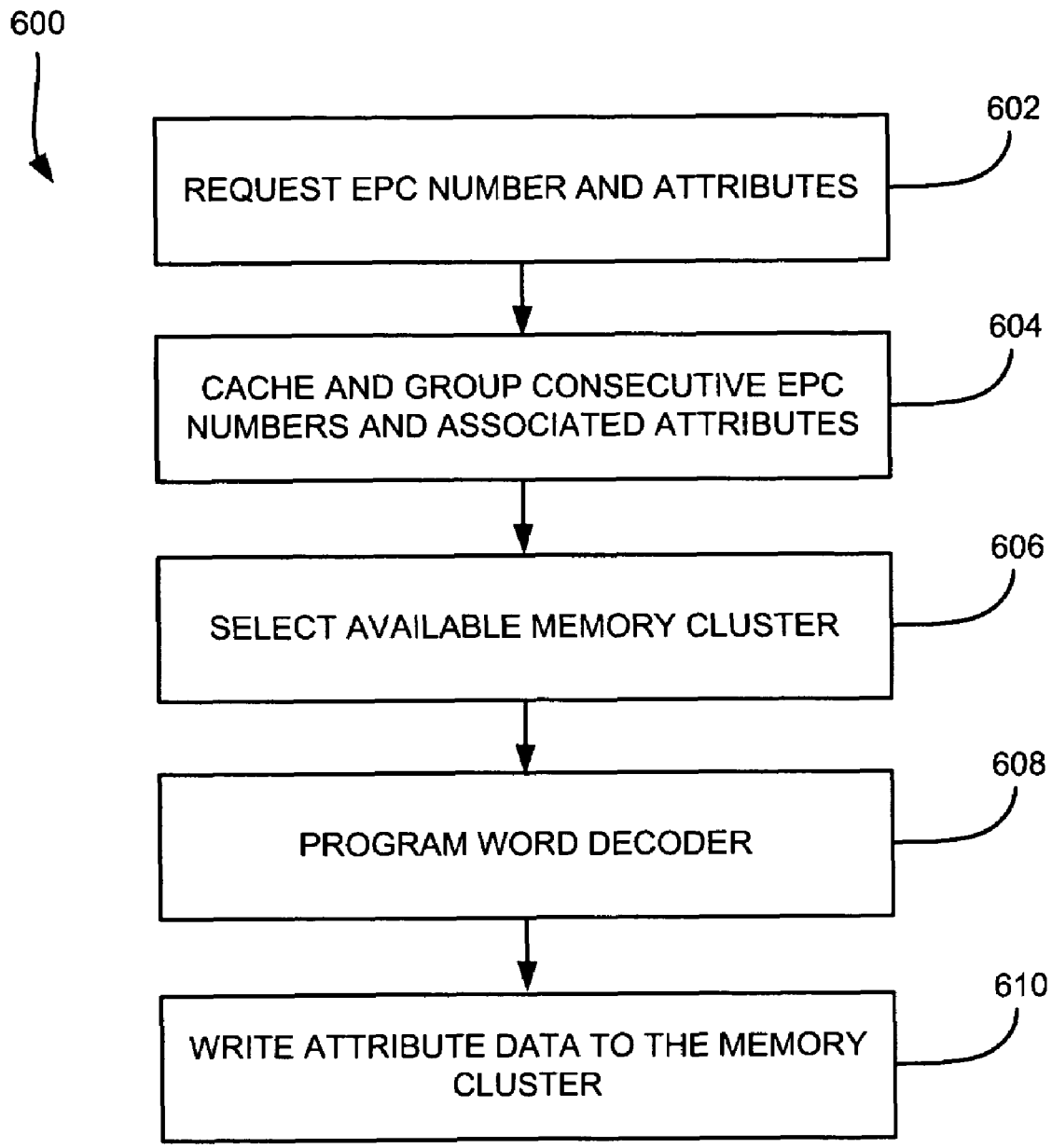
FIG. 6 is a process diagram of a method for populating a memory system according to one embodiment of the present invention.

In one illustrative implementation, shown in the process 600 of FIG. 6, assume pallets of products are coming into a dock door of a large retail store. Each item has an RFID tag coupled to it, and each tag has a unique 96 bit EPC code. Each tag also has attributes associated with the EPC numbers stored in its onboard memory, such as item name and description, expiration date, kill code, etc. As a pallet passes through the dock door, the tags are scanned to request the tag's EPC number and attributes in operation 602. As is likely, several of the items will have consecutive EPC numbers. As each EPC number and associated attributes are received, they are cached in operation 604. Once a group of consecutive EPC numbers and associated attributes are gathered, the attributes are programmed into the memory system. For instance, upon receiving an EPC number and attribute(s), the next empty memory cluster is selected in operation 606, and the associated word decoder is programmed with the first 90 bits (MSBs) of the EPC number in operation 608. The attribute data is also written to the memory cluster in operation 610. Thus, the memory array is populated. Once the decoder is programmed, it will only respond to the address code.

Figure 7:
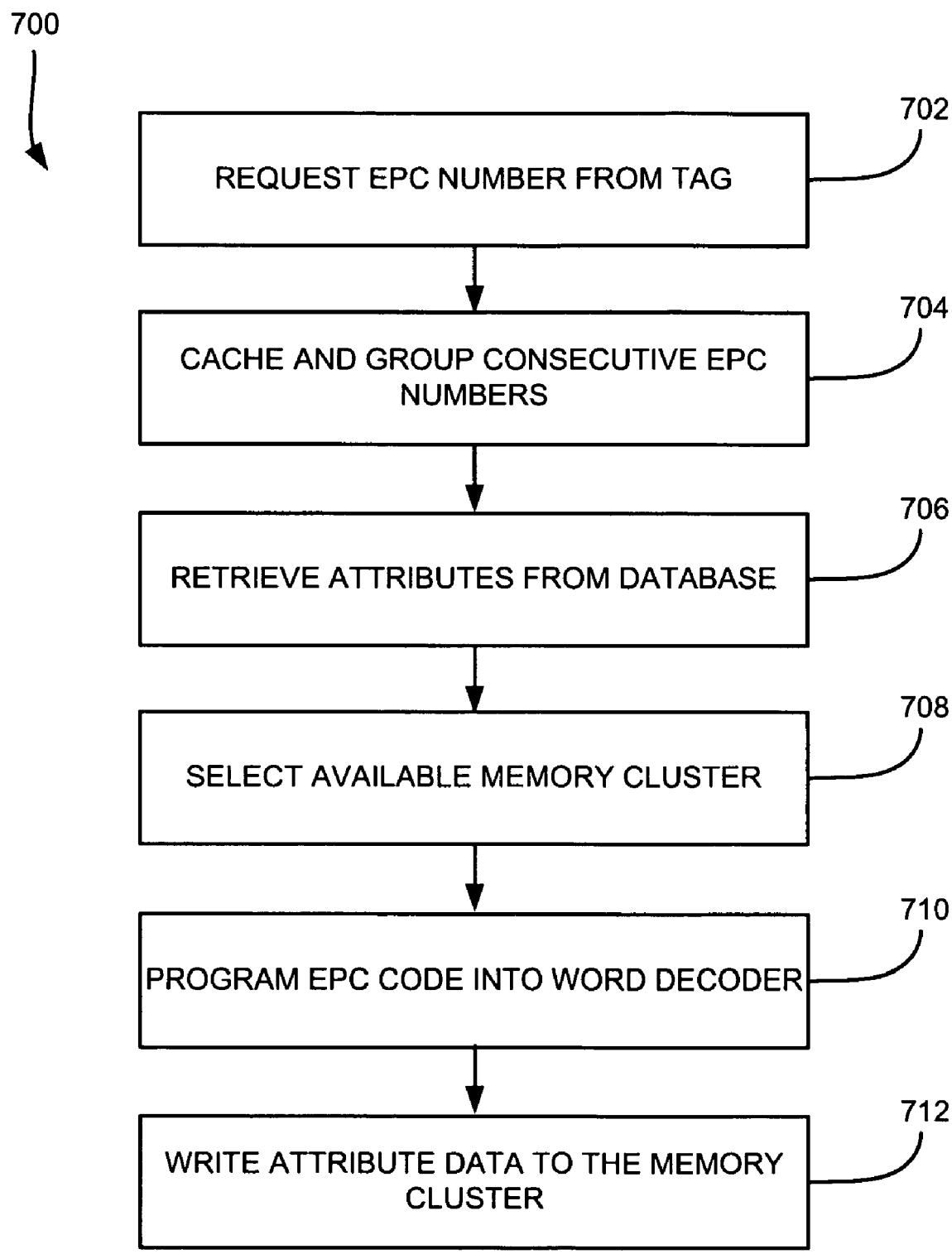
FIG. 7 is a process diagram of a method for populating a memory system according to another embodiment of the present invention.

In another process 700, shown in FIG. 7, assume the attributes are not stored in the tag. Assume the manufacturer has also sent information to the store, such as an electronic manifest of all EPC numbers and attributes associated with the EPC numbers, such as item name and description, expiration date, kill code, etc. As a pallet passes through the dock door, the tags are scanned to request the tag's EPC number in operation 702. As each EPC number is identified, it is cached in local memory and grouped with other EPC numbers consecutive thereto, or at least sharing the same 90 bit MSB address. The attributes associated with the EPC numbers are retrieved from a database housing the manifest in operation 706. As the attributes are received, the EPC number and attributes are programmed into the memory system. For example, upon receiving an EPC number and attribute(s), the next empty memory cluster is selected in operation 708, and the associated word decoder is programmed with the first 90 bits (MSBs) of the EPC number in operation 710. The attribute data is also written to the memory cluster in operation 712.

It should be obvious to those skilled in the art that if more than one word packet of data is stored for any EPC number, then that additional information may be accommodated by any of the nonexhaustive list of following techniques.

1. Redefining one or more of the LSB addresses to use them to select among multiple word packets assigned to a particular EPC code. This may require increasing the size of the CAM word decoder from 90 bits to 92 bits, 96 bits, 128 bits, etc.
2. Assignment of multiple EPC numbers to a single object.
3. Reassignment of one or more MSB addresses to select among multiple groups of word packets assigned to that particular object or tag.
4. Allow expansion of the effective word length by accessing the same EPC number simultaneously in multiple memory chips.

Figure 8:
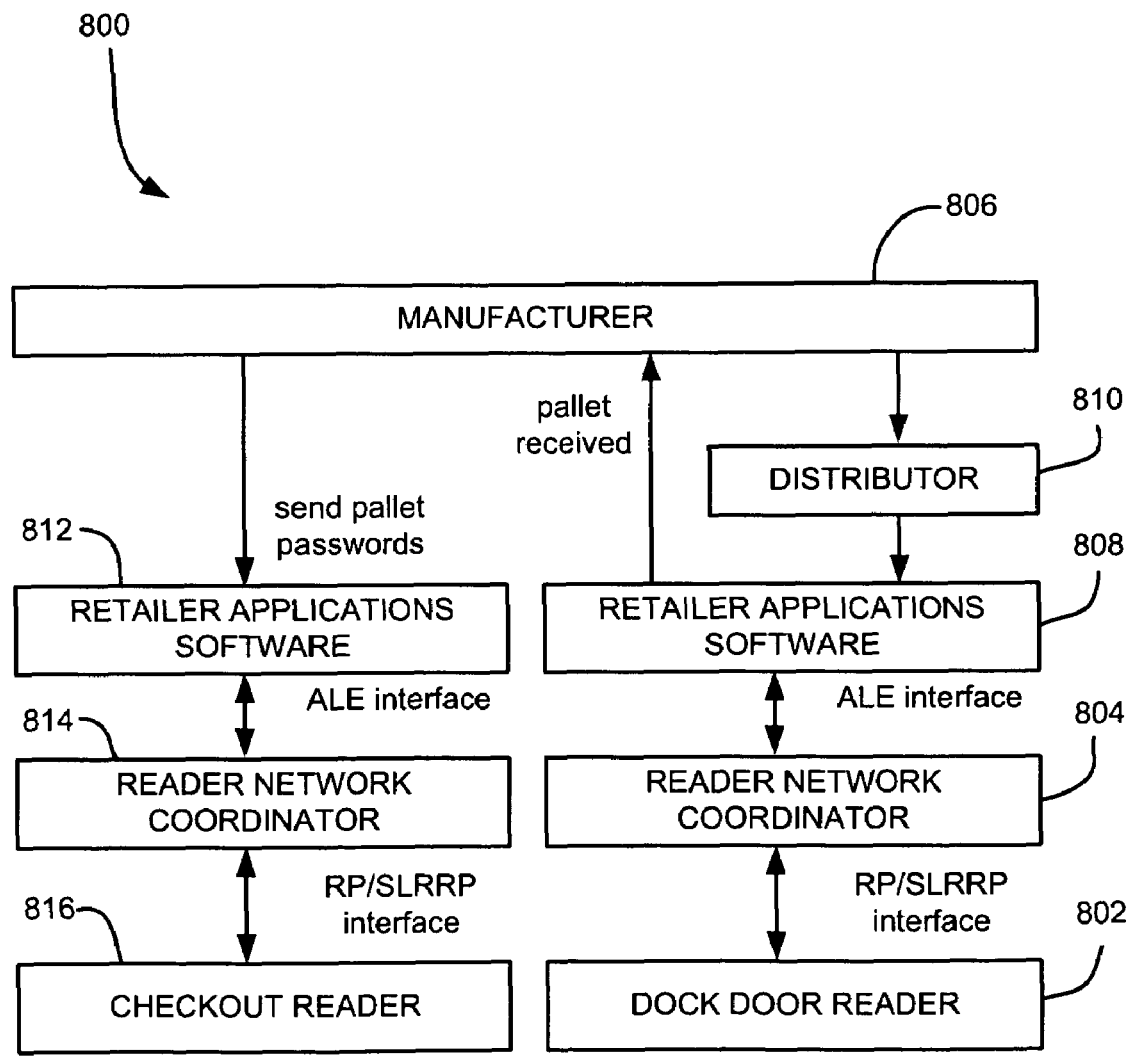
FIG. 8 is a block diagram of a password distribution system according to an embodiment of the present invention.

FIG. 8 graphically depicts a password distribution system 800 for a retail environment. In this example, the reader 802 detects the arrival of a shipment of goods by reading the pallet tag (or case tag, truck tag, barcode, paper receipt, etc.) and this event triggers the point-to-point transmission of all of the ID numbers and passwords associated with that particular pallet of goods to a checkout reader 812. Particularly, the dock door reader 802 communicates with the reader network coordinator 804, which communicates to the manufacturer 806 via retailer applications software 808. It is reasonable to assume that these goods won't be unpacked, moved to the shelves, selected by customers, and purchased for several minutes at least, which is more than enough time for transmitting typically less than 20 kb/pallet of information from the manufacturer 806 to the retailer (software 816) and checkout reader 812 via associated hardware 814 even over a relatively slow internet connection. Notification of the transfer may also be sent to a distributor 810.

As a second alternative, passwords could also be stored and locked into memory on the pallet RFID tag, and then extracted by the retailer upon delivery with the use of a "Master Password".

As a third alternative, the tag KILL code space could be shipped blank and the retailers could algorithmically assign local KILL codes and program them into their local inventory using a single local password.

Now that the word decoders are programmed and the attributes stored to memory, the system can quickly search by EPC number as the products are purchased or otherwise transferred from the store.

In one illustrative implementation, assume that each item in a large retail store has an RFID tag coupled to it, each tag having a unique EPC code associated therewith. To protect the privacy of its customers, the store would like to issue a kill command to each tag as the item is purchased. A typical kill command essentially prevents unauthorized interrogators from retrieving information about the tagged item. The kill process can be initiated by sending a kill code to each tag. The kill code can merely be an instruction (e.g., the kill command itself), or can be a code used by each tag to authenticate the accompanying kill command, e.g., a passcode. A passcode-type authentication of the kill command is preferred to prevent shoplifting by preventing a thief from issuing kill commands to the tags to circumvent a security system.

Thus, a kill code needs to be retrieved for each one of the potentially millions of items in the store, and quickly to avoid any adverse impact on checkout speed. As mentioned above, to find the kill codes associated with each EPC number in software would be very time consuming. Similarly, a pure CAM device would be very expensive. Accordingly, the kill codes are stored in the inventive memory device and retrieved using the items' EPC numbers.

Figure 9:
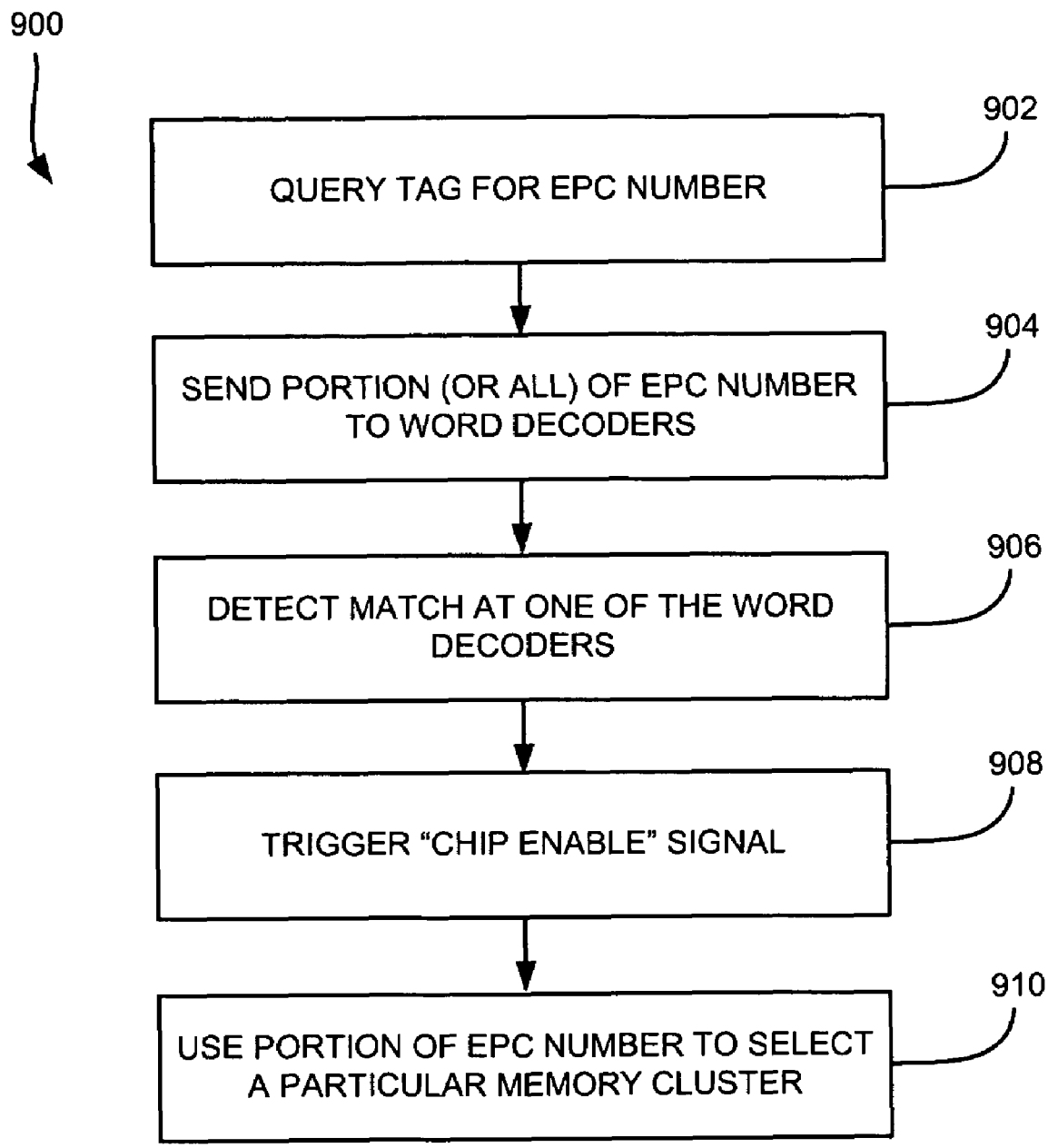
FIG. 9 is a process diagram of a method for retrieving data from a memory system according to an embodiment of the present invention.

FIG. 9 illustrates a method 900 for retrieving a kill code for one item. The method can be sequentially repeated In operation 902, the tag is queried for retrieving the tag's EPC number. In operation 904, the 90 MSBs of the item's 96 bit EPC number are sent to the word decoders to find the memory cluster where the kill passwords are stored. Note that the MSBs of the EPC number can be sent to all of the word decoders simultaneously. Also assume that the memory cluster contains several, e.g., 64 kill codes. In operation 906, the hit detector detects a hit at one of the word decoders. An optional chip enable is triggered by the hit detector 908, which in turn allows the memory system to access the memory cluster. In operation 910, the six LSBs of the item's EPC number are used to select the particular memory cluster storing the kill code. One skilled in the art will appreciate that attributes other than kill codes stored in the memory system can be easily retrieved.

Note that the memory system also allows for parallel reads. In other words, the memory system may store one attribute in one memory cluster and a second attribute in another memory cluster. Assume that two attributes are stored in two different memory clusters in two different chips, and that each uses the same memory address. During the memory cluster identification process, two word decoders will indicate a match. Thus, the two memory clusters may be read, and the two pieces of data are sent to the host.

When an item is purchased, the system knows that the product with specific EPC number is gone, so it may select the associated word decoder, and issue a CLEAR command to reset the word decoder to zero and reset its availability bit to zero (available). If there are multiple attributes stored, the memory cluster and word decoder are not reset until all of the items have been purchased.

One skilled in the art will appreciate that any attribute associated with an EPC number (or any number) can be stored in the memory device and retrieved at will. Such attributes include item description, SKU number, date of manufacture, manufacturer information, expiration date, etc. and combinations thereof.

Other examples of use include storing data associated with numbered currency. Similarly, social security numbers can be used as the memory addresses, and each memory cluster can store information about a person, such as home address.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A memory system, comprising:
a plurality of content addressable word decoders; and
memory cells associated with each of the word decoders,
wherein the memory cells are grouped into memory clusters,
each cluster being associated with one of the word decoders,
the word decoders being simultaneously addressable.

2. A memory system as recited in claim 1, wherein the memory cells are random access memory.

3. A memory system as recited in claim 1, wherein the memory cells are read only memory.

4. A memory system as recited in claim 1, wherein a match of a subset of a memory address to a word stored in one of the word decoders causes the word decoder to select the associated memory cells.

5. A memory system as recited in claim 1, wherein the word decoder has more than 16 address line inputs.

6. A memory system, comprising:
a plurality of content addressable word decoders; and
memory cells associated with each of the word decoders,
wherein a match of a subset of a memory address to a word stored in one of the word decoders causes the word decoder to select the associated memory cells,
wherein the subset of the memory address includes the most significant bits of the address.

7. A memory system, comprising:
a plurality of content addressable word decoders; and
memory cells associated with each of the word decoders,
wherein a match of a subset of a memory address to a word stored in one of the word decoders causes the word decoder to select the associated memory cells,
wherein the memory cells are grouped into memory clusters, wherein each memory cluster includes several memory word packets, each word packet comprising a plurality of memory cells, wherein another subset of the memory address is used to select one of the word packets of the selected memory cluster.

8. A memory system as recited in claim 7, wherein the other subset of the memory address includes least significant bits of the address.

9. A memory system, comprising:
a plurality of content addressable word decoders; and
memory cells associated with each of the word decoders,
wherein a match of a subset of a memory address to a word stored in one of the word decoders causes the word decoder to select the associated memory cells,
wherein the memory address is an RF code associated with an object.

10. A memory system, comprising:
a plurality of content addressable word decoders; and
memory cells associated with each of the word decoders,
wherein a match of a subset of a memory address to a word stored in one of the word decoders causes the word decoder to select the associated memory cells,
wherein the memory address is an RF code associated with an RFID tag.

11. A memory system, comprising:
a plurality of content addressable word decoders; and
memory cells associated with each of the word decoders,
wherein the memory cells are grouped into memory clusters, wherein each memory cluster comprises multiple word packets, each word packet comprising a plurality of memory cells, wherein the word packets in a particular memory cluster contain data associated with a consecutive series of memory addresses.

12. A memory system, comprising:
a word decoder storing a modifiable identifier which is a subset of a memory address, the word decoder being responsive to a match of the identifier and an incoming subset of the memory address,
wherein memory cells are grouped into a memory cluster, the memory cluster being associated with the word decoder, wherein the memory cluster includes several memory word packets, each word packet comprising a plurality of memory cells, wherein another subset of the memory address is used to select one of the word packets of the memory cluster.

13. A memory system as recited in claim 12, wherein a match of the identifier to the incoming subset of the memory address causes the word decoder to select an associated memory cell.

14. A memory system as recited in claim 12, wherein memory cells are grouped into a memory cluster, the memory cluster being associated with the word decoder, wherein the memory cluster includes several memory word packets, each word packet comprising a plurality of memory cells, wherein another subset of the memory address is used to select one of the word packets of the memory cluster.

15. A memory system as recited in claim 12, wherein the other subset of the memory address includes least significant bits of the address.

16. A memory system as recited in claim 12, comprising:
a word decoder storing a modifiable identifier which is a subset of a memory address, the word decoder being responsive to a match of the identifier and an incoming subset of the memory address,
wherein the memory address is an RF code associated with an object.

17. A memory system, comprising:
a word decoder storing a modifiable identifier which is a subset of a memory address, the word decoder being responsive to a match of the identifier and an incoming subset of the memory address,
wherein the subset of the memory address includes most significant bits of the address.

18. A memory system, comprising
a word decoder storing a modifiable identifier which is a subset of a memory address, the word decoder being responsive to a match of the identifier and an incoming subset of the memory address,
a memory cluster associated with the word decoder, the memory cluster comprises multiple memory cells, wherein the memory cells in the memory cluster contain data associated with a consecutive series of memory addresses.

19. A memory system, comprising:
a word decoder array having fewer word decoders than combinations of word decoder addresses, the word decoders in the array being simultaneously addressable.

20. A memory system as recited in claim 19, wherein each word decoder is responsive to a subset of one of the memory addresses.

21. A memory system, comprising:
a word decoder array having fewer word decoders than combinations of word decoder addresses; and
a memory cluster associated with each word decoder, each memory cluster comprises multiple memory cells, wherein the memory cells in a particular memory cluster contain data associated with a consecutive series of memory addresses.

22. A memory system, comprising:
a plurality of memory clusters, each of the memory clusters comprising a plurality of word packets, each word packet comprising a plurality of bits;
a plurality of first addressing mechanisms for selecting a particular one of the clusters; and
a second addressing mechanism for selecting one of the word packets in a selected one of the clusters.

23. A memory system as recited in claim 22, wherein the first addressing mechanisms are responsive to a first subset of a memory address, wherein the second addressing mechanisms are responsive to a second subset of the memory address.

24. A memory system as recited in claim 22, wherein the memory cells in a particular memory cluster contain data associated with a consecutive series of memory addresses.

25. A method for providing access to kill codes, comprising:
identifying an identification number of an RE tag;
matching at least a portion of the identification number to a stored memory address;
accessing a word packet associated with the memory address; and
retrieving a kill code from the word packet.

26. A method as recited in claim 25, wherein the word packet comprises multiple memory cells, and further comprising using at least a portion of the identification number to select one of the memory clusters.

27. A method as recited in claim 25, wherein the word packet comprises multiple memory cells, wherein the word packets contain kill code associated with a consecutive series of identification numbers.

28. A memory system comprised of a plurality of memory clusters, each memory cluster including a plurality of word packets, each word packet including a plurality of memory cells, wherein the word packets in a particular memory cluster contain data associated with a consecutive series of memory addresses.

29. A memory system, comprising
a memory cluster, each memory cluster comprising a plurality of memory cells;
a word decoder; and
a mechanism for simultaneously modifying contents of at least two of the clusters based on information stored in the word decoders.

30. A memory system, comprising:
a plurality of word decoders;
a mechanism for physical access to individual word decoders; and
a mechanism for accessing individual word decoders via a content addressable memory associated therewith.

* * * * *

UNITED STATES PATENT AND TRADEMARK OFFICE
CERTIFICATE OF CORRECTION

PATENT NO. : 7,539,030 B2  Page 1 of 1
APPLICATION NO. : 11/391834
DATED : May 26, 2009
INVENTOR(S) : Stewart It is certified that error appears in the above-identified patent and that said Letters Patent is hereby corrected as shown below:

Column 11, line 18 "repeated In operation" should read --repeated in operation--.

Signed and Sealed this

Twenty-first Day of July, 2009

JOHN DOLL
*Acting Director of the United States Patent and Trademark Office*